(12) United States Patent
Srinivasan et al.

(10) Patent No.: US 7,996,798 B2
(45) Date of Patent: Aug. 9, 2011

(54) REPRESENTING BINARY CODE AS A CIRCUIT

(75) Inventors: Hari Krishnan Srinivasan, Hyderabad (IN); Perraju Bendapudi, Hyderabad (IN)

(73) Assignee: Microsoft Corporation, Redmond, WA (US)

( * ) Notice: Subject to any disclaimer, the term of this patent is extended or adjusted under 35 U.S.C. 154(b) by 100 days.

(21) Appl. No.: 11/753,434

(22) Filed: May 24, 2007

(65) Prior Publication Data

US 2008/0295058 A1 Nov. 27, 2008

(51) Int. Cl.
G06F 9/45 (2006.01)
(52) U.S. Cl. ....................................... 716/103
(58) Field of Classification Search .............. 716/3, 103; 717/106, 141, 143, 144, 161
See application file for complete search history.

(56) References Cited

U.S. PATENT DOCUMENTS

| | | | |
|---|---|---|---|
| 5,461,574 A * | 10/1995 | Matsunaga et al. | 716/2 |
| 6,028,987 A * | 2/2000 | Hirairi | 716/3 |
| 6,662,356 B1 | 12/2003 | Edwards et al. | |
| 7,051,322 B2 | 5/2006 | Rioux | |
| 7,146,606 B2 | 12/2006 | Mitchell et al. | |
| 2003/0014743 A1 | 1/2003 | Cooke et al. | |
| 2004/0111713 A1* | 6/2004 | Rioux | 717/137 |
| 2004/0215684 A1* | 10/2004 | Joye et al. | 708/490 |
| 2005/0060697 A1* | 3/2005 | Bicsak et al. | 717/156 |
| 2006/0041872 A1* | 2/2006 | Poznanovic et al. | 717/140 |
| 2006/0048113 A1 | 3/2006 | Ozone et al. | |
| 2006/0158354 A1 | 7/2006 | Aberg et al. | |
| 2006/0253841 A1 | 11/2006 | Rioux | |
| 2007/0006197 A1 | 1/2007 | Murphy et al. | |

OTHER PUBLICATIONS

Altman et al.; "Advances and Future Challenges in Binary Translation and Optimization"; Nov. 2001; Proceedings of the IEEE, vol. 89, No. 11; All pages.*
Kim et al.; "Dynamic Binary Translation for Accumulator-Oriented Architectures"; 2003; IEEE; All pages.*
Cifuentes et al.; "Binary Translation: Static, Dynamic, Retargetable?"; 1996; IEEE; All pages.*
Cifuentes et al.; "The Design of a Resourceable and Retargetable Binary Translator"; 1999; IEEE; All pages.*
Yu et al.; "Dynamic Binary Translation and Optimization in a Whole-System Emulator-SkyEye"; 2006; IEEE, All pages.*
Wu et al.; "The Accuracy of Initial Prediction in Two-Phase Dynamic Binary Translators"; 2004; IEEE, All pages.*
Thomas Reps et al. "Intermediate-Representation Recovery from Low-Level Code", PERM'06, Jan. 9-10, 2006, Charleston, South Carolina, USA, © 2006 ACM.
Amitabh Srivastava et al. "Vulcan. Binary transformation in a distributed environment", Technical Report, MSR-TR-2001-50, Microsoft Research, Apr. 20, 2001.
Manuel Carro et al. "Some Design Issues in the Visualization of Constraint Logic Program Execution", AGP'98, 1998.
K. Svore et al. "Toward a Software Architecture for Quantum Computing Design Tools", QPL 2004, pp. 127-144.
Michelle Mills Strout et al. "Representation-Independent Program Analysis", PASTE Sep. 5-6, 2005, Lisbon, Portugal, © 2005 ACM.

* cited by examiner

*Primary Examiner* — Suresh Memula
(74) *Attorney, Agent, or Firm* — L. Alan Collins; Collins & Collins Incorporated

(57) ABSTRACT

A high level intermediate representation of a binary is generated. Circuit nodes from the high level intermediate representation are built, wherein a circuit node represents an operation in the high level intermediate representation. The circuit nodes are connecting using a flow analysis of the binary to build a circuit that represents the binary.

17 Claims, 13 Drawing Sheets

```
If (Z !=0)                    ← 302
{
   C = A + B
}
```

```
cmp     dword ptr [ebp+8],0    /* [ebp + 8] is Z      ← 303
je      0040156A
mov     eax,dword ptr [ebp-0Ch]
add     eax,dword ptr [ebp-4]
mov     dword ptr [ebp-8],eax
```

```
CMP Z, 0    /* compare Z to 0                          ← 304
JE Label1   /* if Z=0, then jump
C = A + B
Label1:
...
```

```
#include <iostream.h>                                    702
void main() {
    int a=7, b=131, c;
    cin >> c;
    if( a * c < b ) {
        cout << "\n This block" << "is covered.";
        c=a-b;
                    703
    }
    c++;
    cout<<"\n Value of c now = ";
    cout << c;
}
```

```
void main() {
    int a, b, c, d;
    a = 11;
    b = 2;
    c = 3;
    if(b + a > c)
        d = 17;
    else
        c --;
    c += 2;
}
```

FIG. 11

REPRESENTING BINARY CODE AS A CIRCUIT

BACKGROUND

There are many representations for program analysis or verification at the source code level. However, binary code also needs analysis. Binary analysis may determine the integrity of the binary and look for malicious code. Also, many developers only ship binaries and do not make their source code available to others. However, recipients of such binaries still may wish to verify the integrity of the binary code.

SUMMARY

The following presents a simplified summary of the disclosure in order to provide a basic understanding to the reader. This summary is not an extensive overview of the disclosure and it does not identify key/critical elements of the invention or delineate the scope of the invention. Its sole purpose is to present some concepts disclosed herein in a simplified form as a prelude to the more detailed description that is presented later.

Embodiments of the invention are directed to representing binary code as a circuit. In one example, a binary is extracted to an Intermediate Representation (IR) level and then to a High level Intermediate Representation (HIR). A circuit representation of the binary may then be built from the HIR.

Many of the attendant features will be more readily appreciated as the same become better understood by reference to the following detailed description considered in connection with the accompanying drawings.

BRIEF DESCRIPTION OF THE DRAWINGS

Like reference numerals are used to designate like parts in the accompanying drawings.

FIG. 11 is example code in accordance with an embodiment of the invention.

DETAILED DESCRIPTION

The detailed description provided below in connection with the appended drawings is intended as a description of the present examples and is not intended to represent the only forms in which the present examples may be constructed or utilized. The description sets forth the functions of the examples and the sequence of steps for constructing and operating the examples. However, the same or equivalent functions and sequences may be accomplished by different examples.

Figure 1:
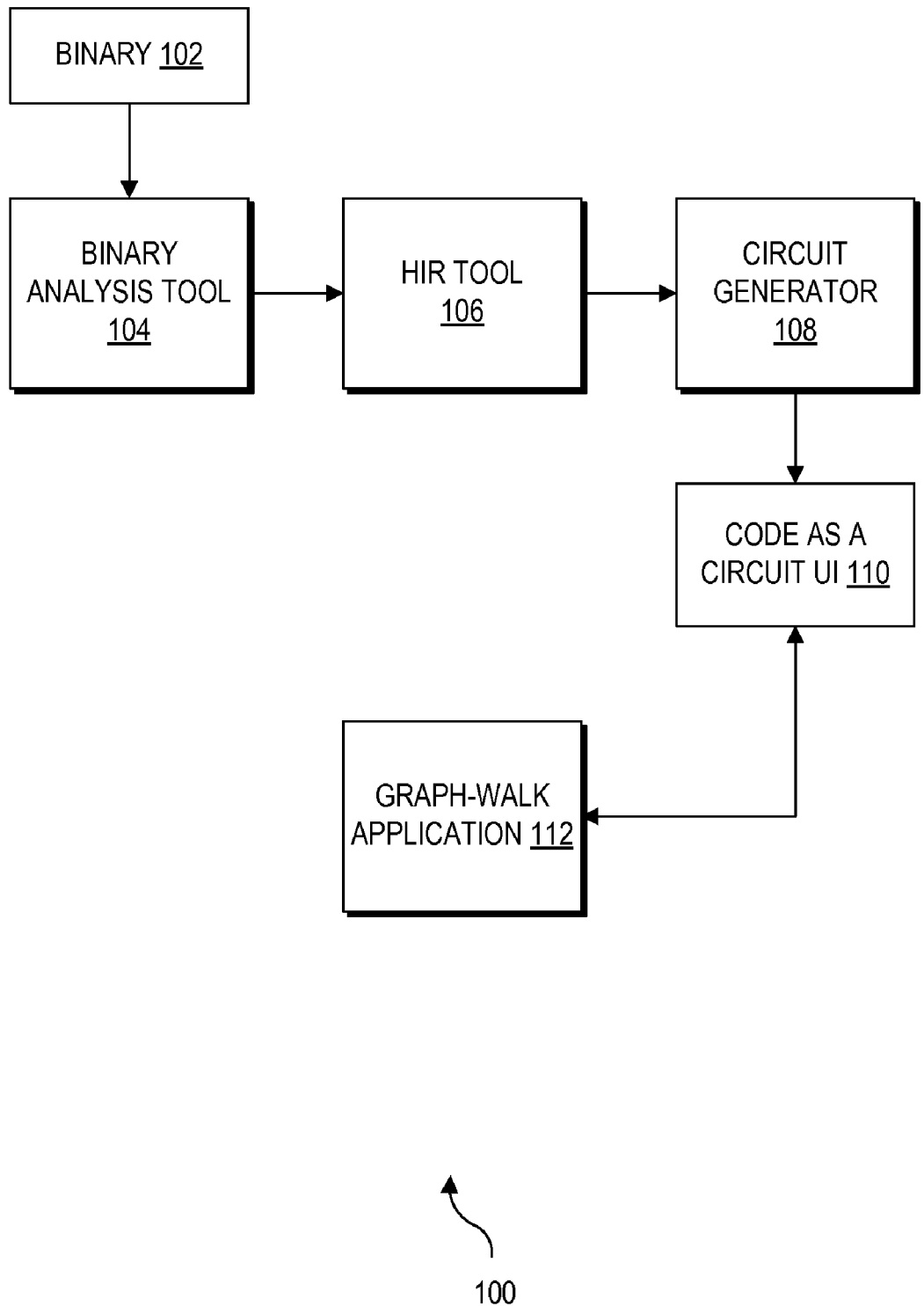
FIG. 1 is a block diagram of a system for building a circuit representation of a binary in accordance with an embodiment of the invention.

FIG. 1 shows a system 100 for building a circuit representation of a binary in accordance with an embodiment of the invention. System 100 includes a binary analysis tool 104, a High level Intermediate Representation (HIR) tool 106, and a circuit generator 108. One or more components of system 100 may be implemented in a "code as a circuit" application using computer readable instructions executed by one or more computing devices. Embodiments of a computing device are discussed below in conjunction with FIG. 13.

Binary analysis tool 104 receives a binary 102 for analysis. A binary includes machine executable code. In one embodiment, binary 102 is compatible with x86 or x64 processor architectures. Binary analysis tool 104 lifts binary 102 to an Intermediate Representation (IR) and performs flow analysis of binary 102. The IR may resemble assembly-like code. In one embodiment, binary analysis tool 104 includes a Microsoft® Vulcan binary analysis tool.

The IR and flow analysis from tool 104 is passed to HIR tool 106. Tool 106 raises the IR to a HIR and performs further flow analysis. HIR tool 106 may remove replace register calls with variables and convert the instruction sequence to a Directed Acyclic Graphical (DAG)-like format.

Circuit generator 108 uses the HIR and enhanced flow analysis from HIR tool 106 to build circuit nodes. The resulting circuit may be presented to a user in a code as circuit User Interface (UI) 110. An example code as a circuit UI is described below in connection with FIG. 12. System 100 may include a graph-walk application 112 to enable a user to walk through the circuit to gather detailed information about the circuit and to perform binary verification, such as backtracking for root cause analysis (discussed below).

Figure 2:
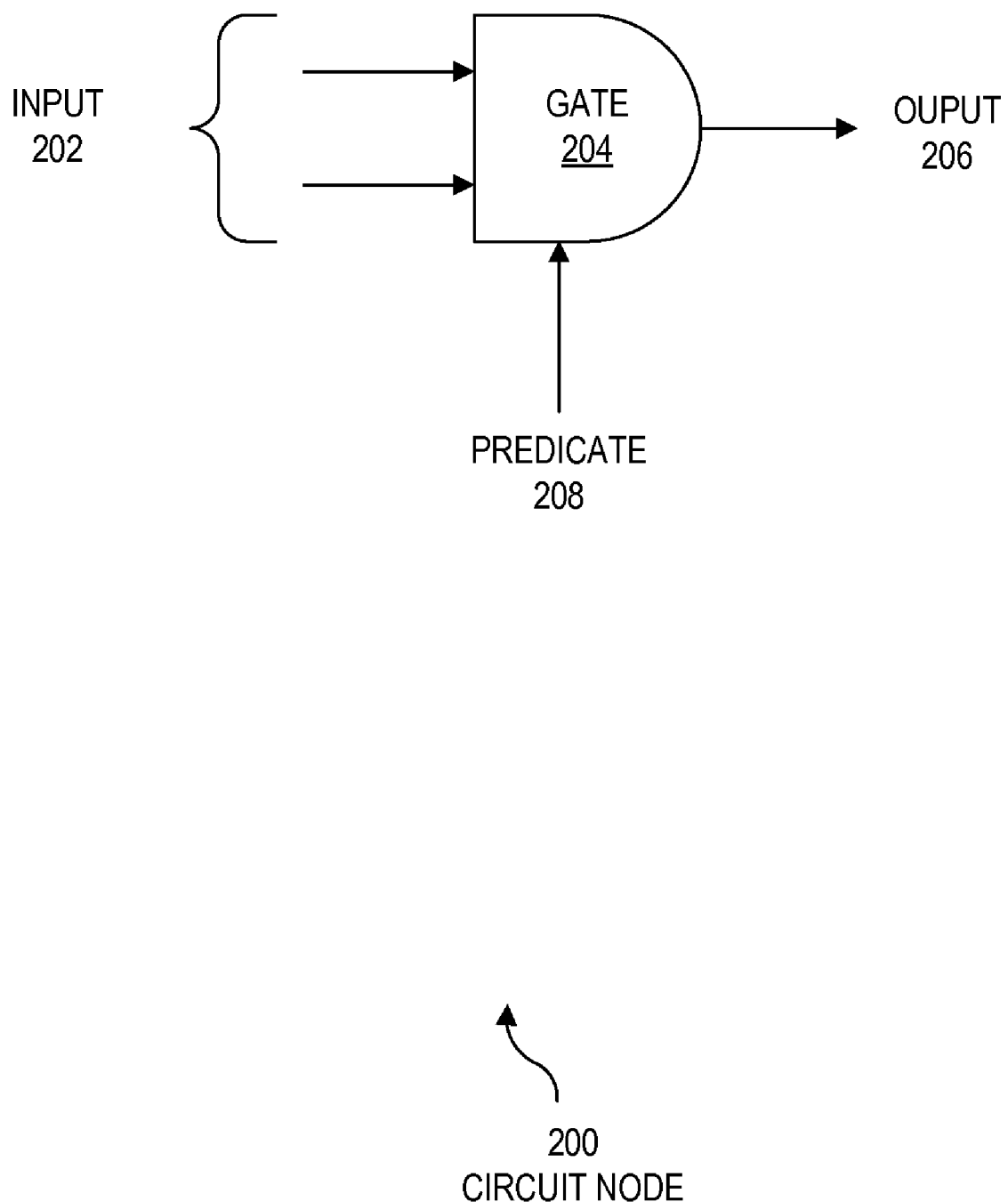
FIG. 2 is a circuit node in accordance with an embodiment of the invention.

Turning to FIG. 2, an embodiment of a circuit node 200 is shown. A circuit node may represent one or more operations in the HIR. As will be discussed further below, a circuit node may represent a program function (i.e., a set of operations). Circuit node 200 includes a gate 204 having one or more inputs 202 and one or more outputs 206. Output 206 may be inputted into another circuit node as part of a circuit. Circuit node 200 may include predicate 208 which is a control condition that enables or disables gate 204. A gate may represent a simple operation, such as ADD, or may represent a defined abstraction whose semantics are known. For example, a gate may represent a C language function "strcat" (string concatenate) that appends two strings together.

Figure 3:
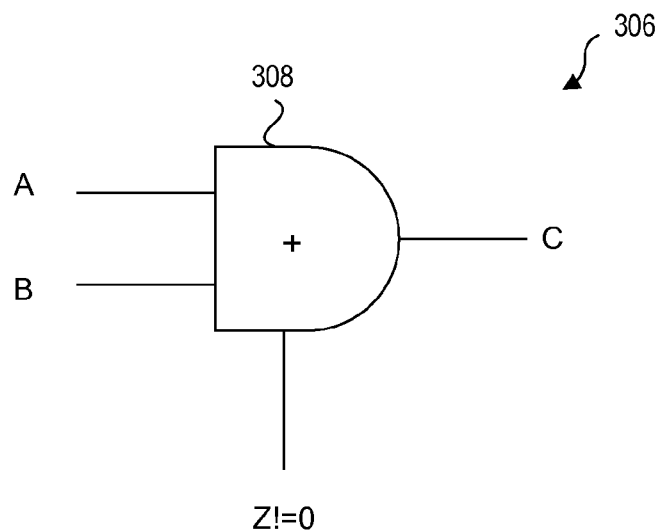
FIG. 3 is a diagram of building a circuit representation of a binary in accordance with an embodiment of the invention.

Turning to FIG. 3, an embodiment of representing binary code as a circuit is shown. A binary (shown in source code form at 302) has been analyzed by binary analysis tool 104. The resulting Intermediate Representation is shown at 303. It will be appreciated that IR 303 appears as assembly-like code (e.g., IR 303 references machine registers). Analysis of IR 303 by HIR tool 106 results in a High-level Intermediate Representation 304. It will be appreciated that HIR 304 is a high level abstraction of the binary that is machine independent and in a directed acyclic like format. HIR 304 shows a compare statement where if Z does not equal zero, then variable C takes on the sum of variables A and B.

HIR 304 may be expressed using circuit node 306. In circuit node 306, the inputs A and B are provided to a gate 308 that performs an addition operation. The predicate of node 306 is the compare statement ("CMP Z, 0") of HIR 304. Thus, when Z is not equal zero, then the addition operation of gate 308 may be performed to add inputs A and B and output the sum as output C. In one embodiment, when multiple circuit nodes are connected to create a circuit, the circuit flow is read from left-to-right. As will be described below, the circuit may be traced backwards (i.e., read from right-to-left) to determine potential root causes of a flawed output.

Figure 4:
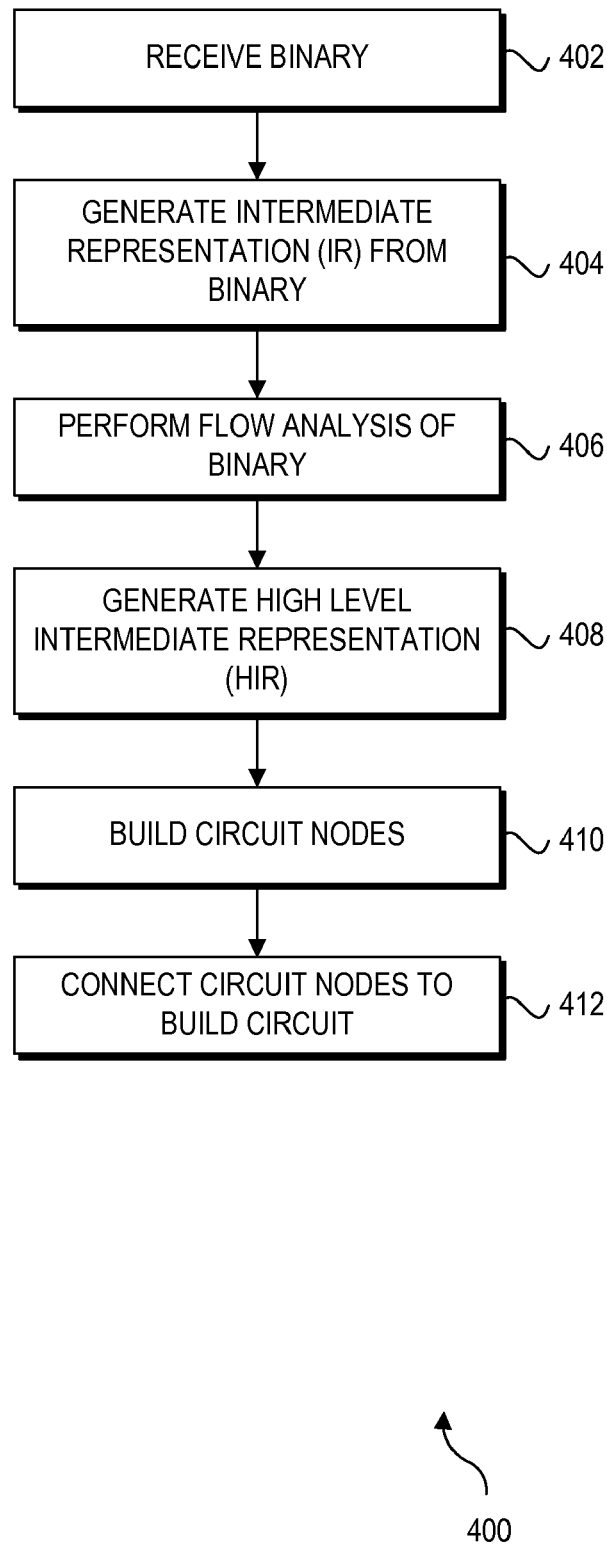
FIG. 4 is a flowchart showing the logic and operations of building a circuit representation of a binary in accordance with an embodiment of the invention.

Turning to FIG. 4, a flowchart 400 shows the logic and operations of representing binary code as a circuit in accordance with an embodiment of the invention. In one embodiment, at least a portion of the logic of flowchart 400 may be implemented by computer readable instructions executable by one or more computing devices.

Starting at block 402, a binary is received. At block 404, an IR is generated of the binary. Next, at block 406, flow analysis of the binary is performed. In one embodiment, the logic of blocks 404 and 406 may be performed by a binary analysis tool such as Microsoft® Vulcan.

Proceeding to block 408, a HIR is generated from the IR and the flow analysis. Generating the HIR raises the IR to a platform independent representation which is easier for code analysis. For example, register calls are replaced with temporary variables and global/stack variables as appropriate. Generating the HIR includes performing enhanced flow analysis that may investigate factors such as virtual functions, global references, field references, and the like. At least a portion of this enhanced flow analysis is performed using the IR. In one embodiment, Microsoft® Symval APIs may be used to raise the IR to an HIR. An embodiment of generating the HIR is discussed below in connection with FIG. 6.

Next, in block 410, circuit nodes are built from the HIR. Each circuit node may be a simple operation (e.g., add, subtract, greater than comparison, etc.) or represent a function having several operations which semantics may be defined (e.g., a strcat function, a user-defined function, etc.). Continuing to block 412, the circuit nodes are connected using the enhanced flow analysis to build the circuit. In one embodiment, the circuit may be built for a subset of operations or edges that are of interest.

Figure 5:
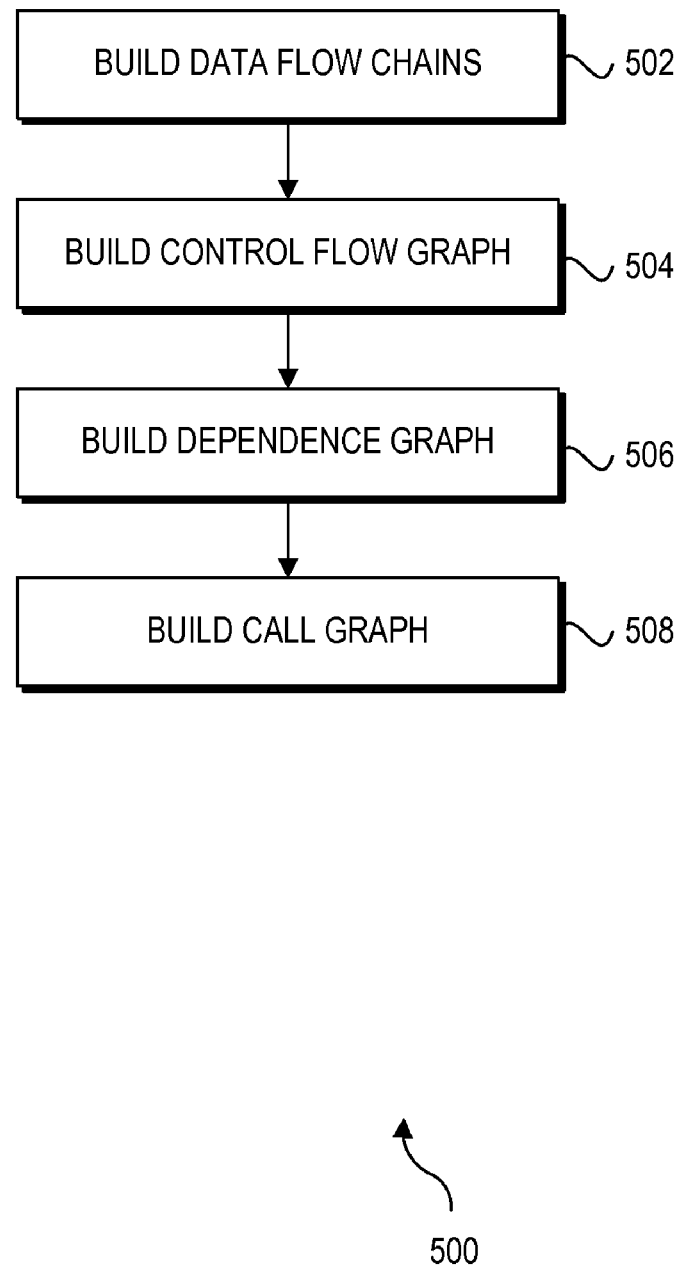
FIG. 5 is a flowchart showing the logic and operations of building a circuit representation of a binary in accordance with an embodiment of the invention.

Turning to FIG. 5, a flowchart 500 shows the logic and operations of representing binary code as a circuit in accordance with an embodiment of the invention. Flowchart 500 shows an embodiment of performing flow analysis of the binary, as in block 406. In one embodiment, at least a portion of the logic of flowchart 500 may be implemented by computer readable instructions executable by one or more computing devices.

Starting in block 502, data flow chains are built to abstract the flow of data in the binary. Proceeding to block 504, a control flow graph is built that describes the paths that the binary execution may take. In one embodiment, the stream of instructions is divided into basic blocks (i.e., a portion of code without a jump). The basic blocks are connected according to the control flow to produce the control flow graph. Next, in block 506, a dependence graph is built that abstracts how a set of instructions depend on a conditional (i.e., predicate) instruction for execution.

Next, in block 508, a call graph is built. The call graph describes the calling interactions between basic blocks. In one embodiment, the call sites for direct calls are connected. These direct calls may be used later to connect circuit nodes. A call to an import is marked as a pseudo circuit node. An import is a call to a function in an external module which may be made using libraries (e.g., dynamic linking), Component Object Model (COM), etc., in which case these instructions (i.e., the external module) are not available for analysis. These calls may be simulated using a pseudo circuit node to represent the external module.

Figure 6:
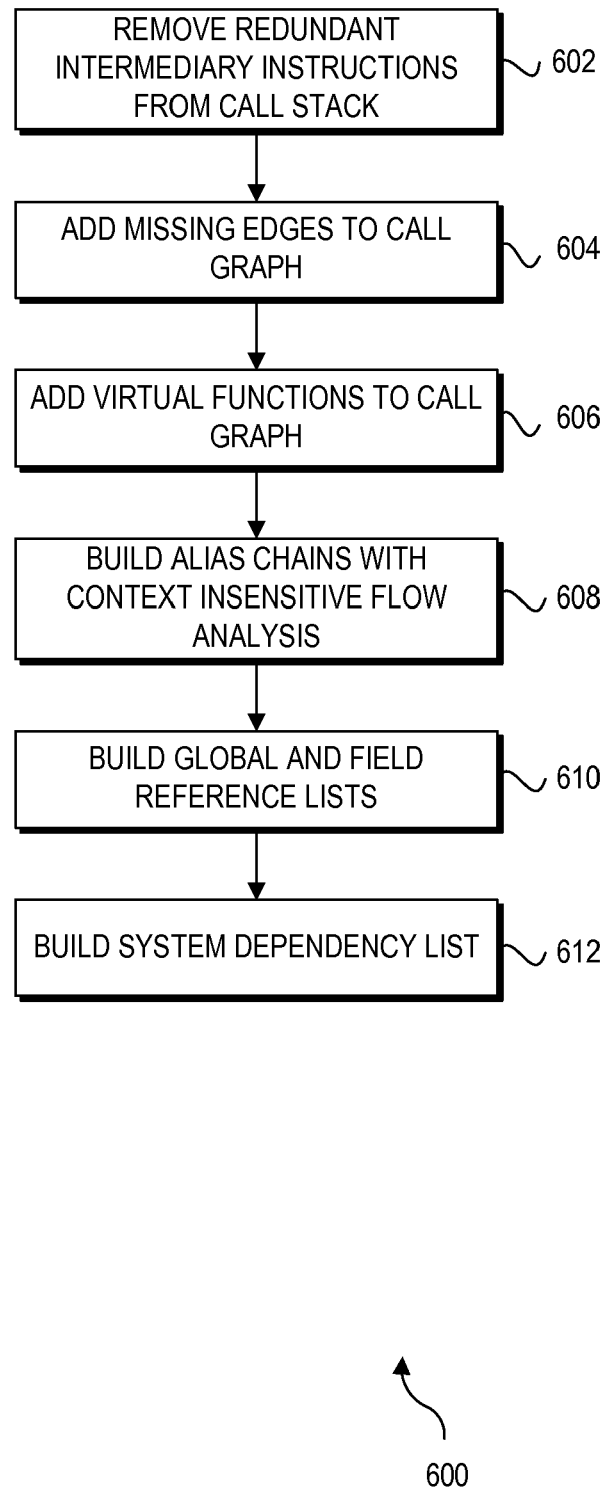
FIG. 6 is a flowchart showing the logic and operations of building a circuit representation of a binary in accordance with an embodiment of the invention.

Turning to FIG. 6, a flowchart 600 shows the logic and operations of representing binary code as a circuit in accordance with an embodiment of the invention. Flowchart 600 shows an embodiment of generating an HIR, as in block 408. Analysis performed in flowchart 600 may be performed using the IR. In one embodiment, at least a portion of the logic of flowchart 600 may be implemented by computer readable instructions executable by one or more computing devices.

Starting in block 602, redundant intermediary instructions are removed from the call stack associated with the binary. Proceeding to block 604, context insensitive flow analysis is used to add missing edges to the call graph. In context insensitive flow analysis, all possible calls between basic blocks are represented, while in context sensitive flow analysis, values of the variables are taken into account when connecting the basic blocks.

Next, in block 606, virtual functions are added to the call graph using context insensitive flow analysis and relocation information. Relocation information is used to detect the virtual calls that are made through virtual function tables (vtables). Since vtables have a specific format embedded with relocations/fixups, the vtables can be used to determine the possible locations of a virtual call.

Proceeding to block 608, alias chains are built with context insensitive flow analysis for alias variables in the binary. Flow insensitive alias analysis is used to connect HIR nodes to add more information to the data flow chains.

Continuing to block 610, a global reference list and a field reference list are built for global variables and fields, respectively, in the binary. In object oriented programming, a field (also referred to as data member) is data within a class and is available to each instance of the class. Global variables and fields may be connected across call boundaries. This will help in tracking value flow through global variables and field members.

Next, in block 612, a system dependency list is built for the binary. The system dependency list describes system variables (e.g., config file, registry, etc.) that the binary is dependent on. These system variables may be read from the platform on which the binary is to execute. The system variables in the dependency list may then by simulated by special circuit nodes and supplied with any value as desired. For example, reads or writes to system locations, like a registry store/file, may be marked as special circuit nodes which can be supplied any value in the circuit graph simulation. In another example, if a binary reads the registry to obtain the Internet Explorer® version, the registry on that machine can be read and passed to the code as a circuit application for simulation.

Figure 7:
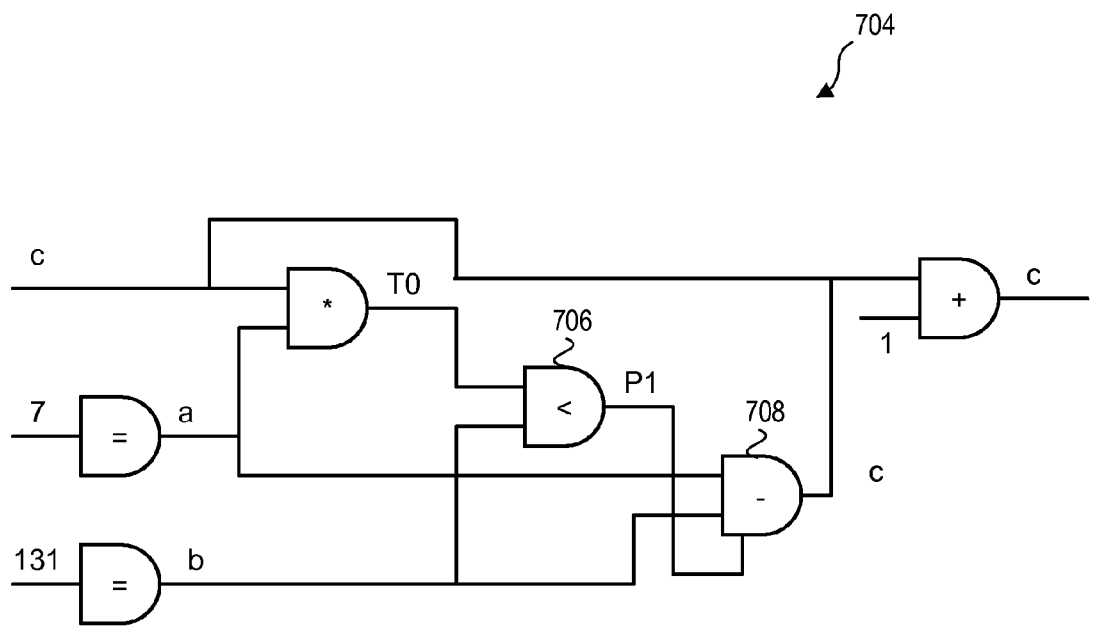
FIG. 7 is a circuit representation of a binary in accordance with an embodiment of the invention.

Embodiments of the invention may be used for analysis of a binary. Such analysis may include static debugging, code coverage analysis, root cause analysis, and runtime tracing. FIG. 7 illustrates how embodiments of the invention may be used for improving code coverage testing. Code 702 is represented as a circuit 704. Code 702 (and code in FIGS. 8, 10, and 11) is shown as pseudo code to aid in understanding, but it will be understood that circuit 702 is built from the binary code version of code 702. Tracing circuit 704 backwards exposes the code coverage for testing the binary. Ranges for a variable that may result in uncovered code may be discovered. Testing may then be modified to ensure coverage of this previously uncovered variable range.

In FIG. 7, if variable c is greater than 18, then the "if" block of code 702 would not get covered. In circuit 704, the "if" block is entered at node 706 and the Boolean output of node 706 serves as a predicate for node 708. Node 708 corresponds to statement 703 in the "if" block of code 702. Thus, by walking backwards through circuit 704, a user may determine which values of variable c will result in the coverage of the code represented by node 708.

Figure 8:
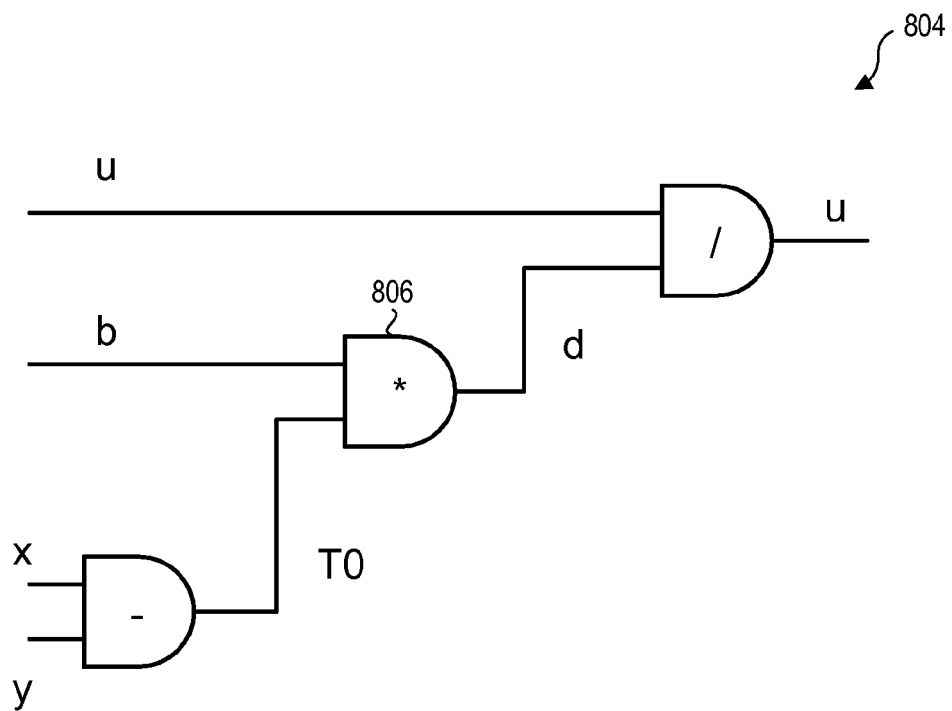
FIG. 8 is a circuit representation of a binary in accordance with an embodiment of the invention.

FIG. 8 shows another example of using embodiments of the invention for determining code coverage. In this example, a user wants to determine under what conditions a divide by zero error may occur. Code 802 is represented by circuit 804. In this example, a user wants to determine under what conditions the statement "u/=d" would attempt to divide variable u by zero (i.e., determine when d is equal to zero). By walking backwards through circuit 804, the user may determine that d will be zero when one of the inputs to circuit node 806 is zero (i.e., when b equals zero or x equals y).

Figure 9:
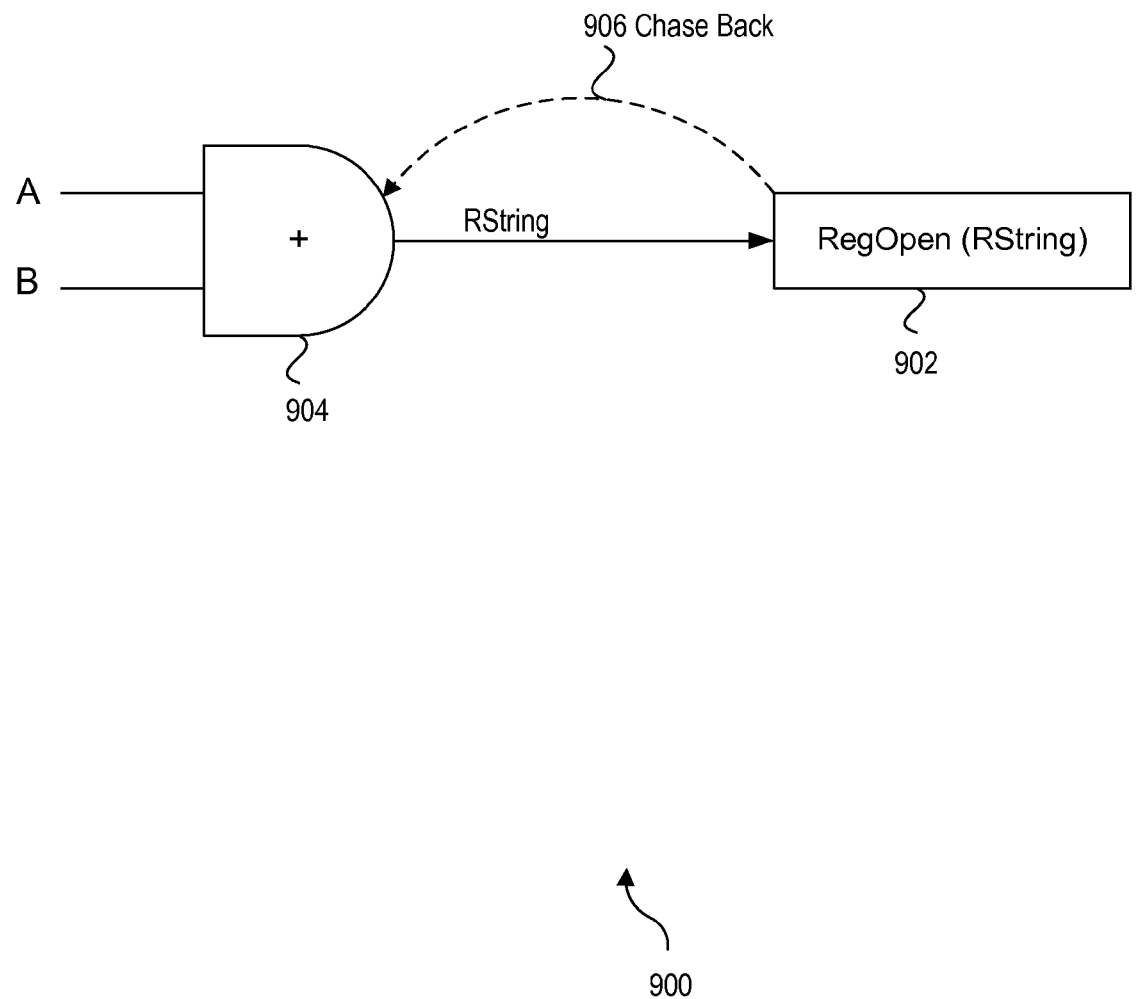
FIG. 9 is a circuit representation of a binary in accordance with an embodiment of the invention.

Turning to FIG. 9, a circuit 900 may be used in registry key analysis. Operation RegOpen 902 is used to open a registry key having the specified key name passed in as RString. Circuit node 904 performs a concatenation (shown by a '+' symbol) on strings A and B to form RString. In analysis of the circuit graph, given RString, a user can chase back 906 to determine the input string. For example, RString may be built by performing:

strcpy (RString, "HKEY_LOCAL_MACHINE\Software\Microsoft\Internet Explorer");
    strcat(RString,"Version"); /* concatenation as in gate 904
    Regopen(RString)

Using circuit 900, given RString, the user can chase back to find the complete input string to RegOpen 902 is "HKEY_LOCAL_MACHINE\Software\Microsoft\Internet Explore\Version".

Figure 10:
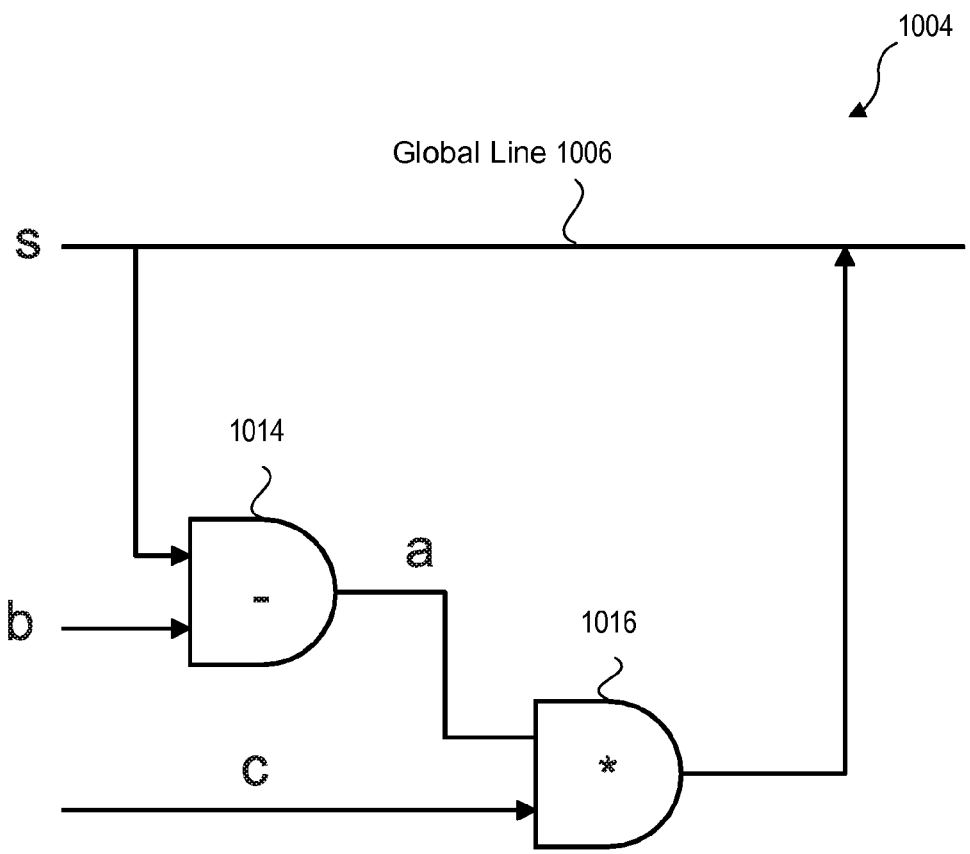
FIG. 10 is a circuit representation of a binary in accordance with an embodiment of the invention.

In embodiments herein, circuit representations may be built per function (also referred to as a procedure) in a binary without having global and inter-functional edges or may be built for the binary as a whole. Turning to FIG. 10, an embodiment of the invention involving global variables is shown. Code 1002, represented by circuit 1004, has a global variable s. In code 1002, a use of global variable s is shown at 1010 and a definition of global variable s is shown at 1012. In circuit 1004, global variable s is shown as a global line 1006. Global line 1006 may serve as an input to a circuit node and be modified by a circuit node output. The "uses" and "definitions" of global variable s by nodes in circuit 1004 may simply be connected to global line 1006. In circuit 1004, node 1014 corresponds to global variable s use at 1010 and node 1016 corresponds to global variable s definition at 1012.

Global line 1006 (also referred to as a global edge) may be carried across multiple procedure calls. In an alternative embodiment, an inter-functional edge may also be represented similarly as global line 1006. An inter-functional edge may follow along the side of the circuit and will terminate at program exit points.

Figure 12:
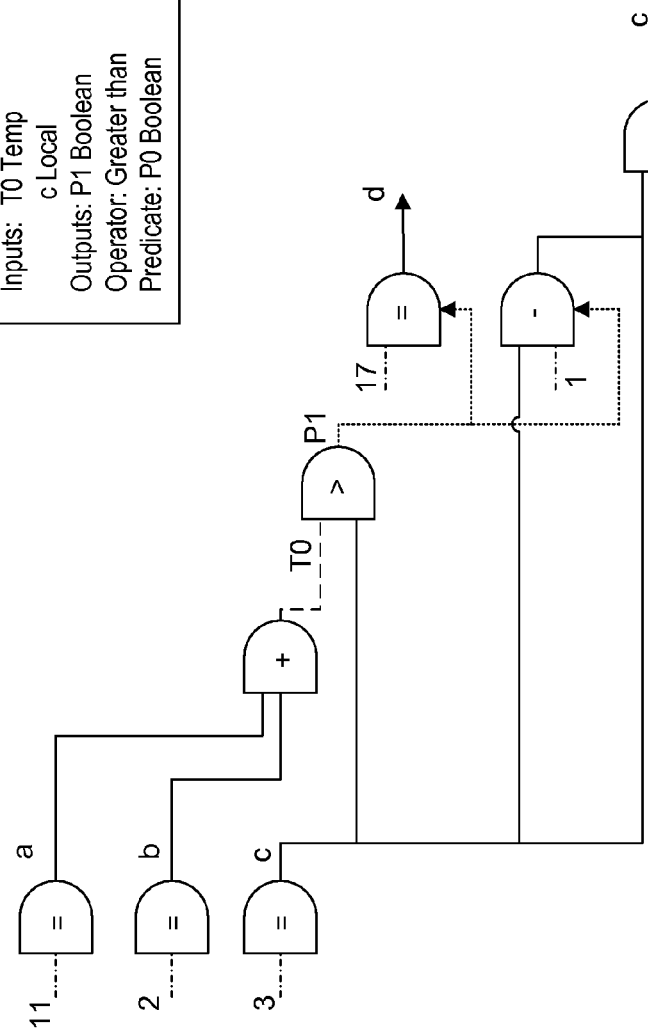
FIG. 12 is a code as a circuit user interface in accordance with an embodiment of the invention.

Turning to FIGS. 11 and 12, FIG. 12 shows an embodiment of a code as a circuit UI 1200 for displaying a circuit representing code 1100 in FIG. 11. UI 1200 includes circuit section 1202, assembly instructions 1204, and circuit information section 1206. UI 1200 also includes a button "Open Binary" 1208 to select a binary for circuit representation.

Circuit section 1202 shows a circuit that represents code 1100. At the bottom of section 1202 is a key for the connections between nodes of the circuit. The key includes connections for local variables, temporary variables, Boolean variables, and immediate variables. Values for variables may be fed into the circuit and the circuit "executed" for evaluating the circuit logic.

Section 1204 shows an Intermediate Representation of the binary (labeled "Assembly instructions"). The user can view the IR of the binary that was used to construct the circuit. In one embodiment, the instructions shown in section 1204 include assembly instructions derived by Microsoft® Vulcan.

Section 1206 includes information about the circuit. A user may select portions of the circuit in section 1202 to display detailed information in section 1206. For example, a user may select a gate to learn more information about that particular gate. In FIG. 12, the user has selected gate number 5 (the "greater than" gate). Section 1206 shows that the inputs to gate number 5 are temporary variable T0 and local variable c. The output of gate number 5 is Boolean P1. Gate number 5 has a predicate of Boolean P0. P0 is an always true predicate for a set of instructions that are not guarded by any condition (such as on entry to a function).

In one embodiment, graph-walk application 112 may be used to walk over the graphical representation of the circuit shown in UI 1200. The graph-walk application may be used in root cause analysis of the binary code. For example, a user may use the circuit representation to find the set of variables that drive an output. If the output is faulty, then the circuit may be traced backwards from the output to find an input variable that may be a potential cause of the bad output. To obtain the set of instructions that might influence the output variable, the graph-walk application may traverse over the data and predicate edges backwards from the given output. Also, variables found on the edges (such as global variables) may be tracked as the circuit is traversed backwards.

Also, given the circuit representation, a user may see the independent flow paths that are available within a block of code, such as within a function. For example, multiple independent operations may be performed within a function like adding values to a list and then checking for the consistency of the list. These operations can be reviewed separately as independent operations by looking at the circuit graph in UI 1200.

In one embodiment, the user may define a portion of the circuit as a "black box" and define the semantics for the black box. The semantics may include the inputs and resulting outputs. The black box may represent a function (e.g., user-defined, library call, etc.) where the circuit node inputs are parameters passed to the function and the circuit node outputs are return values of the function. For example, a portion of the circuit may include a strcat function. When the function strcat is encountered by the graph-walk application, a simulation of the function takes the two strings, concatenates them, and returns the output without walking over a circuit graph of the strcat function. This enables a user to focus the circuit on the section of code of interest.

Embodiments herein may be used for debugging code with runtime trace data. A trace of the code may be collected that includes the values involved at the predicates where a control transfer decision was made. A circuit representation of the code may be used to statically rerun and debug the code using the collected trace information. Information that is lost at join points during the flow analysis may be marked. For example, see the following code:

```
Switch (a)
{
    Case 1:
        x = &p;
    Case 2:
        x = &z;
    ...
}
y = *x;
```

Imprecise static analysis may lose which specific location the value of x came from (i.e., case 1 or case 2). At runtime, since the specific path that is taken is known, the path can be tracked and recorded. In the above example, the user will then know which path (case 1 or case 2) was taken at runtime. The trace shows which path is taken during runtime and helps a user understand the root cause of a crash or other error. In some cases, call sites that cannot be resolved during static analysis may be resolved with runtime tracing.

Embodiments of the invention enable binary code to be represented as a circuit. Portions of the code may be represented by circuit nodes that are connected according to flow analysis of the binary code to produce a circuit representation. The circuit may help a user visualize the dependencies between variables and the flow of data. Embodiments of the invention may reduce code review time and aid in detection of code bugs. Also, embodiments herein may be used with dynamic tracing using data available at runtime.

Figure 13:
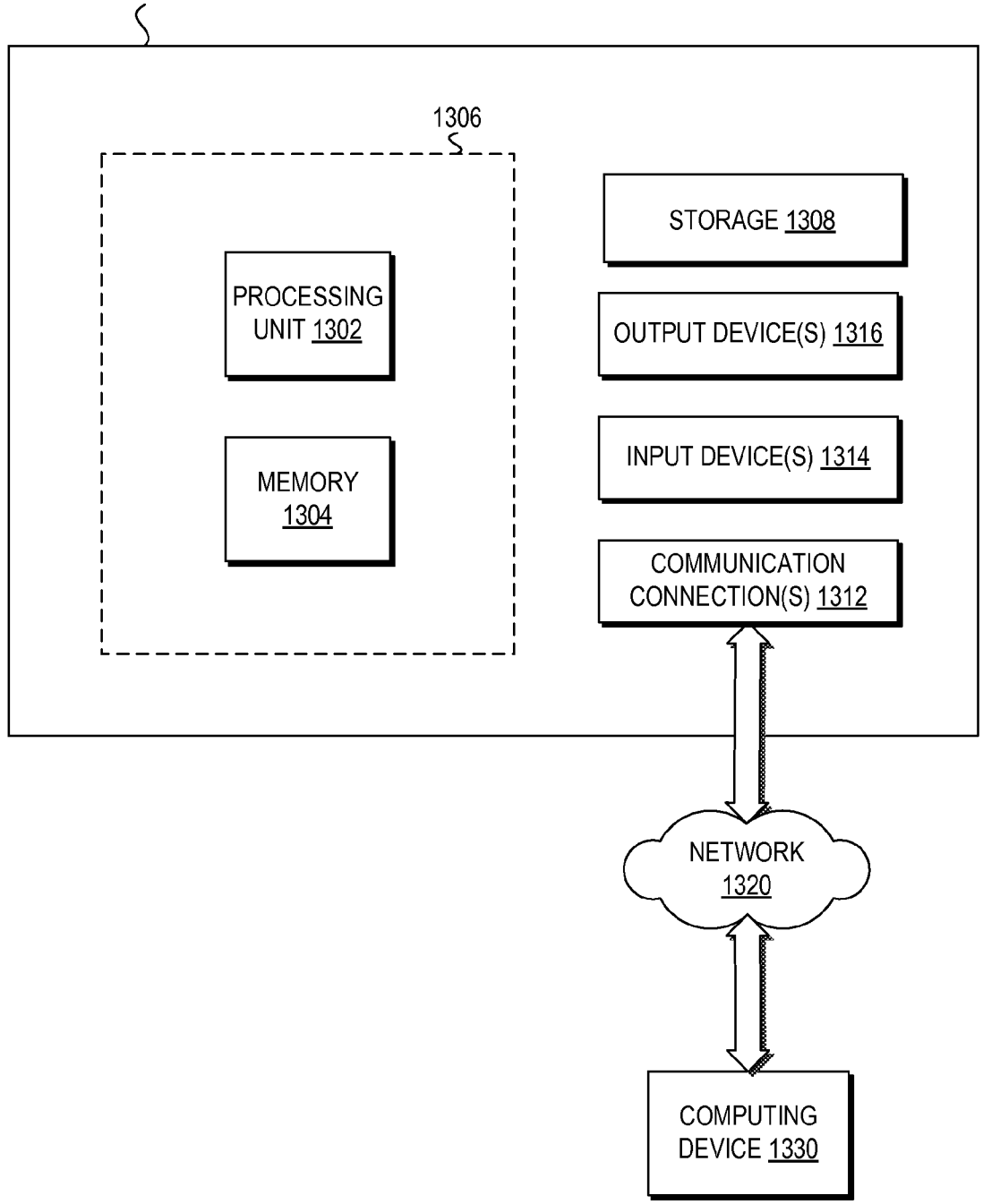
FIG. 13 is a block diagram of an example computing device for implementing embodiments of the invention.

FIG. 13 and the following discussion are intended to provide a brief, general description of a suitable computing environment to implement embodiments of the invention. The operating environment of FIG. 13 is only one example of a suitable operating environment and is not intended to suggest any limitation as to the scope of use or functionality of the operating environment. Other well known computing devices, environments, and/or configurations that may be suitable for use with embodiments described herein include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments of the invention are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 13 shows an example of a computing device 1300 for implementing one or more embodiments of the invention. In one configuration, computing device 1300 includes at least one processing unit 1302 and memory 1304. Depending on the exact configuration and type of computing device, memory 1304 may be volatile (such as RAM), non-volatile (such as ROM, flash memory, etc.) or some combination of the two. This configuration is illustrated in FIG. 13 by dashed line 1306.

In other embodiments, device 1300 may include additional features and/or functionality. For example, device 1300 may also include additional storage (e.g., removable and/or non-removable) including, but not limited to, magnetic storage, optical storage, and the like. Such additional storage is illustrated in FIG. 13 by storage 1308. In one embodiment, computer readable instructions to implement embodiments of the invention may be in storage 1308. Storage 1308 may also store other computer readable instructions to implement an operating system, an application program, and the like.

The term "computer readable media" as used herein includes computer storage media. Computer storage media includes volatile and nonvolatile, removable and non-removable media implemented in any method or technology for storage of information such as computer readable instructions or other data. Memory 1304 and storage 1308 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 1300. Any such computer storage media may be part of device 1300. The term "computer storage media" as used herein refers to a statutory article of manufacture that is not a signal or carrier wave per se.

Device 1300 may also include communication connection(s) 1312 that allow device 1300 to communicate with other devices. Communication connection(s) 1312 may include, but is not limited to, a modem, a Network Interface Card (NIC), an integrated network interface, a radio frequency transmitter/receiver, an infrared port, a USB connection, or other interfaces for connecting computing device 1300 to other computing devices. Communication connection(s) 1312 may include a wired connection or a wireless connection. Communication connection(s) 1312 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency, infrared, Near Field Communication (NFC), and other wireless media.

Device 1300 may include input device(s) 1314 such as keyboard, mouse, pen, voice input device, touch input device, infrared cameras, video input devices, and/or any other input device. Output device(s) 1316 such as one or more displays, speakers, printers, and/or any other output device may also be included in device 1300. Input device(s) 1314 and output device(s) 1316 may be connected to device 1300 via a wired connection, wireless connection, or any combination thereof. In one embodiment, an input device or an output device from another computing device may be used as input device(s) 1314 or output device(s) 1316 for computing device 1300.

Components of computing device 1300 may be connected by various interconnects, such as a bus. Such interconnects may include a Peripheral Component Interconnect (PCI), such as PCI Express, a Universal Serial Bus (USB), firewire (IEEE 1394), an optical bus structure, and the like. In another embodiment, components of computing device 1300 may be interconnected by a network. For example, memory 1304 may be comprised of multiple physical memory units located in different physical locations interconnected by a network.

In the description and claims, the term "coupled" and its derivatives may be used. "Coupled" may mean that two or more elements are in contact (physically, electrically, magnetically, optically, etc.). "Coupled" may also mean two or more elements are not in contact with each other, but still cooperate or interact with each other (for example, communicatively coupled).

Those skilled in the art will realize that storage devices utilized to store computer readable instructions may be distributed across a network. For example, a computing device 1330 accessible via network 1320 may store computer readable instructions to implement one or more embodiments of the invention. Computing device 1300 may access computing device 1330 and download a part or all of the computer readable instructions for execution. Alternatively, computing device 1300 may download pieces of the computer readable instructions, as needed, or some instructions may be executed at computing device 1300 and some at computing device 1330. Those skilled in the art will also realize that all or a portion of the computer readable instructions may be carried out by a dedicated circuit, such as a Digital Signal Processor (DSP), programmable logic array, and the like.

Various operations of embodiments of the present invention are described herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment of the invention.

The above description of embodiments of the invention, including what is described in the Abstract, is not intended to be exhaustive or to limit the embodiments to the precise forms disclosed. While specific embodiments and examples of the invention are described herein for illustrative purposes, various equivalent modifications are possible, as those skilled in the relevant art will recognize in light of the above detailed description. The terms used in the following claims should not be construed to limit the invention to the specific embodiments disclosed in the specification. Rather, the following claims are to be construed in accordance with established doctrines of claim interpretation.

What is claimed is:

1. A method comprising:
generating a high level intermediate representation of a binary, wherein the binary comprises machine executable code;
building circuit nodes based on the high level intermediate representation, wherein a circuit node represents at least one operation represented by the high level intermediate representation;
connecting the circuit nodes based on a flow analysis of the binary resulting in a circuit comprising the connected circuit nodes that represents the binary, wherein at least one of the circuit nodes includes a predicate input that is configured to enable and disable the at least one of the circuit nodes based on a conditional instruction of the binary;
displaying the connected circuit nodes as a circuit representing the binary, wherein each circuit node is displayed as a gate, using a gate symbol, with one or more inputs and one or more outputs; and
wherein the method is performed by a computer.

2. The method of claim 1 wherein the high level intermediate representation is a platform independent representation of the binary.

3. The method of claim 2 wherein generating the high level intermediate representation comprises replacing a register call in the binary with a call to a variable.

4. The method of claim 1 wherein generating the high level intermediate representation converts the binary into a directed acyclic format.

5. The method of claim 1 wherein the circuit nodes are built representing a subset of operations in the high level intermediate representation.

6. The method of claim 1 wherein the plurality of operations includes a function, and wherein a circuit node input represents a parameter passed to the function, and wherein a circuit node output represents a return value of the function.

7. The method of claim 1, further comprising walking through the displayed circuit using a graph-walk application.

8. At least one computer storage media storing computer readable instructions that, when executed by a computer, cause the computer to perform operations comprising:
generating an intermediate representation of a binary, wherein the binary comprises machine executable code;
performing a flow analysis of the binary;
generating a high level intermediate representation of the binary based on the intermediate representation;
building circuit nodes based on the high level intermediate representation, wherein a circuit node represents at least one operation represented by the high level intermediate representation;
connecting the circuit nodes based on the enhanced flow analysis resulting in a circuit comprising the connected circuit nodes that represents the binary, wherein at least one of the circuit nodes includes a predicate input that is configured to enable and disable the at least one of the circuit nodes based on a conditional instruction of the binary; and
displaying the connected circuit nodes as a circuit representing the binary, wherein each circuit node is displayed as a gate, using a gate symbol, with one or more inputs and one or more outputs.

9. The at least one computer storage media of claim 8, the operations further comprising:
building data flow chains of the binary;
building a control flow graph of the binary;
building a dependence graph of the binary; and
building a call graph of the binary.

10. The at least one computer storage media of claim 8 wherein generating the high level intermediate representation comprises removing redundant intermediary instructions from a call stack associated with the binary.

11. The at least one computer storage media of claim 8 wherein generating the high level intermediate representation comprises adding missing edges to a call graph of the binary based on context insensitive flow analysis of the binary.

12. The at least one computer storage media of claim 11 wherein generating the high level intermediate representation comprises adding virtual functions to the call graph.

13. The at least one computer storage media of claim 8 wherein generating the high level intermediate representation comprises building alias chains from alias variables in the binary.

14. The at least one computer storage media of claim 8 wherein generating the high level intermediate representation comprises:
- building a global reference list representing global variables in the binary;
- building a field reference list representing class field members in the binary; and
- building a system dependency list, wherein the system dependency list includes system variables that the binary is dependent on from a platform configured to execute the binary.

15. A computing system, comprising a binary analysis tool configured to generate an intermediate representation (IR) of a binary and to perform flow analysis of the binary, wherein the binary comprises machine executable code;
- a high level intermediate representation (HIR) tool coupled to the binary analysis tool, the HIR tool configured to generate an HIR based on the IR and to perform an enhanced flow analysis;
- a circuit generator coupled to the HIR tool, the circuit generator configured to build circuit nodes based on the HIR and to connect the circuit nodes based on the enhanced flow analysis resulting in a circuit that represents the binary, wherein at least one of the circuit nodes includes a predicate input that is configured to enable and disable the at least one of the circuit nodes based on a conditional instruction of the binary; and
- an output device configured to display the connected circuit nodes as a circuit representing the binary, wherein each circuit node is displayed as a gate, using a gate symbol, with one or more inputs and one or more outputs, wherein the displaying is performed by the computing system.

16. The system of claim 15, further comprising:
- a graph-walk application configured to walk through the graphical representation of the circuit.

17. The system of claim 15 wherein the high level intermediate representation is a platform independent representation of the binary.

* * * * *